United States Patent [19]

Schneider et al.

[11] Patent Number: 5,664,679
[45] Date of Patent: Sep. 9, 1997

[54] TRANSPORT CONTAINER FOR WAFER-SHAPED OBJECTS

[75] Inventors: Heinz Schneider; Peter Fabian, both of Jena, Germany

[73] Assignee: Jenoptik Aktiengesellschaft, Jena, Germany

[21] Appl. No.: 663,485

[22] Filed: Jun. 13, 1996

[30] Foreign Application Priority Data

Nov. 3, 1995 [DE] Germany .................. 195 40 963.9

[51] Int. Cl.⁶ .................................................. B65D 85/30
[52] U.S. Cl. .................... 206/711; 206/710; 206/454; 414/940; 118/500
[58] Field of Search ................... 206/213.1, 454, 206/710, 711, 712, 832, 833; 414/217, 292, 940; 118/500

[56] References Cited

U.S. PATENT DOCUMENTS

| | | | |
|---|---|---|---|
| 4,609,103 | 9/1986 | Bimer et al. | 206/711 |
| 4,739,882 | 4/1988 | Parikh et al. | 206/711 |
| 4,804,086 | 2/1989 | Grohrock | 206/710 |
| 5,169,272 | 12/1992 | Bonora et al. | 414/217 |
| 5,255,783 | 10/1993 | Goodman et al. | 206/454 |
| 5,346,518 | 9/1994 | Baseman et al. | 206/711 |

*Primary Examiner*—David T. Fidei
*Attorney, Agent, or Firm*—McAulay Fisher Nissen Goldberg & Kiel, LLP

[57] ABSTRACT

A transport container for wafer-shaped objects to keep particles away from and remove them from the interior of the transport container when opening the latter, in particular also those particles located in the door gaps, without restricting handling. Cleaning in the form of a self-cleaning process should also be effective when a plurality of transport containers are stacked one on top of the other and the latter should be optionally accessible. At least parts of the rear wall region of a closable container enclosure are constructed as a plenum chamber which has a closable air inlet and a closable air outlet in the base region and cover region, and a connection is formed from the latter to the interior of the container via a filter. The air inlet is constructed so as to complement a connection of a gas reservoir and an air outlet of an additional transport container for coupling. The arrangement is applicable in the manufacture of integrated circuits.

3 Claims, 2 Drawing Sheets

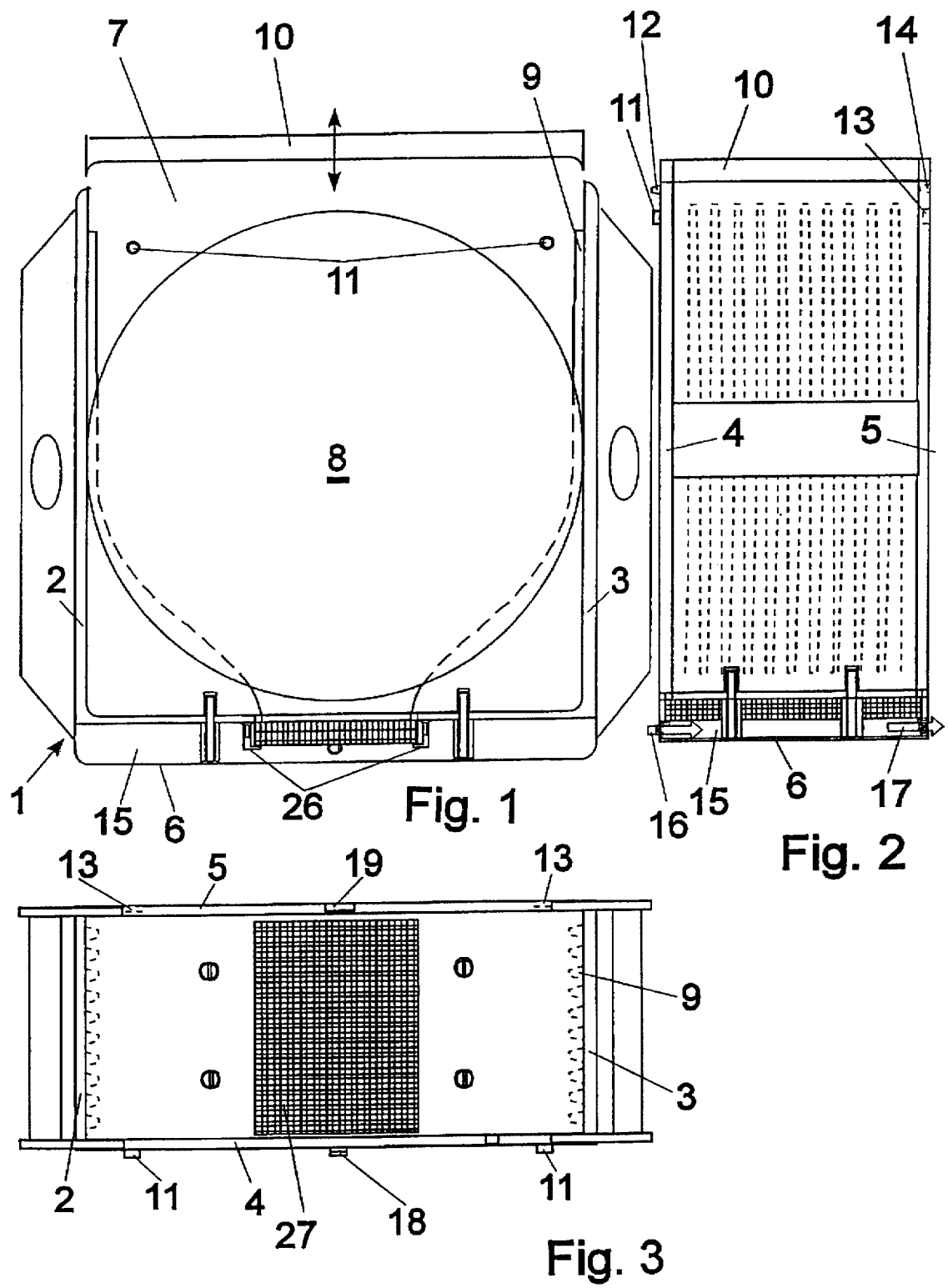

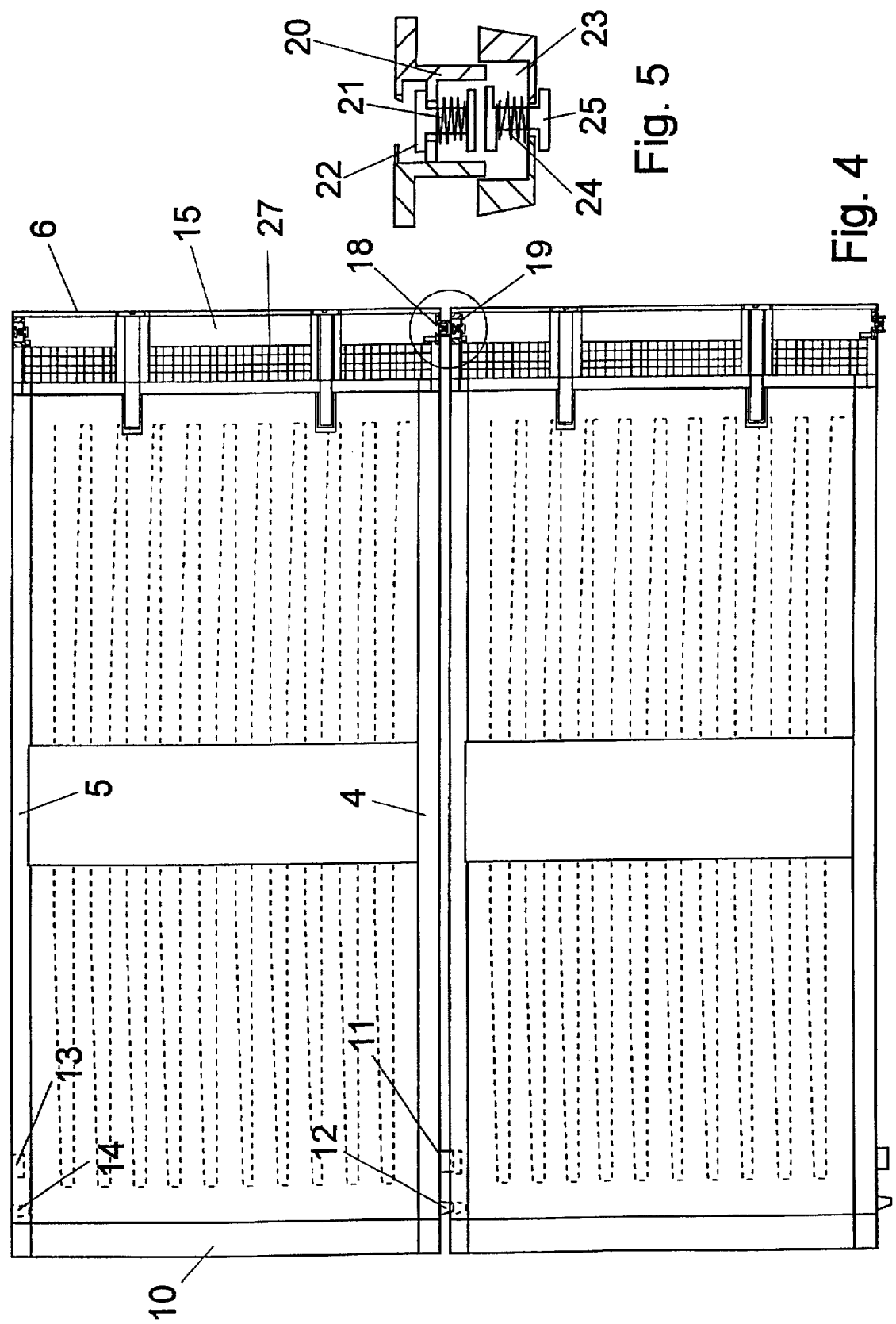

TRANSPORT CONTAINER FOR WAFER-SHAPED OBJECTS

BACKGROUND OF THE INVENTION a) Field of the Invention

The invention is directed to a transport container for wafer-shaped objects in which a container enclosure is made up of two lateral regions which are located opposite one another and have projections forming shelves for receiving objects, a base region, a cover region, and a rear wall region, wherein an opening for removing and charging which is located opposite the rear wall region can be closed by a container door and removal and charging are effected in a plane parallel to the surface of the objects.

b) Description of the Related Art

For the purpose of transporting in the production process and for charging semiconductor processing installations, it is known to use so-called SMIF boxes having a relatively small enclosed volume as magazine containers. As is conventional, the box can be placed on an opening mechanism in an enclosure or housing which encloses one or more work stations so as to keep them free of dust. The box and opening mechanism have closing elements which are adapted to one another and which can be opened simultaneously one above the other so that dust particles resting on the outside of the closing elements can be enclosed therebetween when the semiconductor magazine is lowered into the housing together with the two closing elements. The box itself encloses the opening formed in the housing. As a result of cyclical removing and charging movements performed with the opening and closing of the boxes, the particle concentration generated by friction increases on the surfaces of the semiconductors and in the surrounding air.

In order to prevent disruptions in the gas atmosphere in the housing when opening the SMIF box, U.S. Pat. No. 5,169,272 describes a process and a device which provide a stepwise lowering of the releasable bottom accompanied by generation of pressure differentials for the purpose of cleaning the SMIF box. The generated pressure differential prevents gas from entering the clean room during the lowering process or while cleaning the SMIF box with gas which is guided in the region of the bottom from one side of the SMIF box to the opposite side.

In order to ensure the clean room conditions within the box, it is known from EP 313 693 A1 to provide a duct which connects the interior of the SMIF box directly with an exterior region. A vacuum or overpressure can be generated in the SMIF box via the duct and gas can also be transported into the interior. Particles are to be removed by alternately generating pressure and pumping out via a filter located in the interior of the box.

A disadvantage in these solutions consists in that the flow of gas through the interior of the box is incomplete.

An exchange of gas in the SMIF box can be carried out within an effective time period by means of a technical solution according to WO 95/05 002 A1, in which a gas feed duct opens into gas distributing means from closable ducts incorporated in the wall of the box. A gas discharge line communicates with a gas outlet which adjoins the magazine in the opposite direction to that of the gas distributing means.

The technique of SMIF boxes is especially suitable for semiconductor wafers having a conventional small diameter of 100 to 200 mm. In view of the material characteristics of the semiconductor wafers, these SMIF boxes and the magazines used with them are becoming less suitable as transporting containers as the diameters of semiconductor wafers increase.

It is known to use transporting containers constructed according to a completely different design which simultaneously perform the function of magazines. Removal and charging of the semiconductor wafers which are inserted in shelves within the container is effected individually in a plane parallel to the surface of the semiconductor wafers, wherein the transporting container can be closed by a container cover which is directed substantially at right angles to the removal and charging plane. Accordingly, in contrast to the SMIF box, the container cover is removed and inserted laterally rather than in a downward direction. For effective use in semiconductor production, there must be optional access to a plurality of transport container which are stacked one on top of the other.

There is increased technical interest in maintaining the cleanness of the interior of the container since stricter requirements for classes of clean rooms have necessarily resulted due to the fact that the surface of semiconductor wafers has more than doubled and since the absolute quantity of particles increases statistically in the enlarged air volume. Further, a vacuum pressure is instantly generated in the interior when the door of the container is opened resulting in uncontrolled air turbulence so that particles can enter the container and be deposited therein.

Known battery-operated activated boxes which are continuously provided with pure air via an internal filter system have the disadvantage that the required air flow of approximately 0.5 m/s and the output of battery-operated motors associated therewith can no longer be applied as containers become larger, especially if the containers are still to be handled manually.

OBJECT AND SUMMARY OF THE INVENTION

The primary object of the present invention is to keep particles away from and remove them from the interior of the transport container when opening the latter, particularly those particles located in the door gaps, without restricting handling. Cleaning in the form of a self-cleaning process should also be effective when a plurality of transport containers are stacked one on top of the other and the latter should be optionally accessible.

This object is met by means of a transport container for wafer-shaped objects in which a container enclosure is made up of two lateral regions which are located opposite one another and have projections forming shelves for receiving objects, a base region, a cover region, and a rear wall region, wherein an opening for removing and charging which is located opposite the rear wall region can be closed by a container door and removal and charging are effected in a plane parallel to the surface of the objects. At least parts of the rear wall region are constructed as a plenum chamber which has a closable air inlet and a closable air outlet in the base region and cover region, and a connection is formed from the latter to the interior of the container via a filter. The air inlet is constructed so as to complement a connection of a gas reservoir and an air outlet of an additional transport container for coupling.

Valves are advantageously used in the air inlet and air outlet for opening and closing, a projection at one valve penetrating into a recess at the other valve for reciprocal locating and locking.

The plenum chamber is coupled with the gas reservoir in the stored state in which the container door closes the container enclosure as well as when charging and unloading a semiconductor processing machine during which the container enclosure is opened.

The connection of a plenum chamber with a transport container guarantees an opening of the latter in accordance with clean room principles and ensures exchange of the wafer-shaped objects and charging and unloading of the semiconductor processing machines under clean room conditions.

Overpressure prevails in the interior of the container shortly after the transport container or a stacked structure of containers is connected to the gas reservoir. The supply of compressed air is effected in an individual transport container via the valve for the air inlet and, in the case of a stack of containers, by means of the outwardly open valve for the air inlet. The other valves for the air inlet are connected in each instance with a valve for the air outlet by means of the stacking process.

The overpressure prevailing in the interior of the container prevents the formation of a vacuum pressure when the transport container is opened. At the same time, as a result of the continuous supply of compressed air, a flow of pure air uniformly flowing against the wafer-shaped objects is generated as soon as the door is opened. When the door is closed, the objects are in a static pure-air atmosphere.

Cleaning cycles which would otherwise be necessary are dispensed with by means of the self-cleaning process provided in the invention.

The invention will be explained more fully in the following with reference to the schematic drawings.

BRIEF DESCRIPTION OF THE DRAWINGS

In the drawings:

FIG. 1 shows a top view of an open transport container;

FIG. 2 shows a side view of the transport container;

FIG. 3 shows a view of the rear wall of the transport container;

FIG. 4 shows a group of two stacked transport containers; and

FIG. 5 shows valves of the air inlet and air outlet, which valves engage in one another.

DESCRIPTION OF THE PREFERRED EMBODIMENTS

According to FIGS. 1 to 4, the transport container is formed of a container enclosure 1 which is made up of opposite side walls 2, 3, a base region 4, a cover region 5, and a rear wall region 6. A removal and charging opening 7 for wafer-shaped objects 8, e.g., semiconductor wafers or masks, is left open opposite the rear wall region 6. Projections 9 which form shelves in the opposite side walls 2, 3 serve to receive these wafer-shaped objects 8. Removal and charging of objects 8 is effected individually in a plane parallel to the surface of the objects 8. A container door 10 serves to close the opening 7 and is set into the container enclosure in a recessed manner for this purpose and subsequently locked in a suitable manner.

Centering pins 11 and a guide rail 12 along with corresponding depressions 13, 14 adapted to the latter for engaging are provided at the outside of the container enclosure so that the correct position can be found quickly when placing the transport container on a corresponding holding element, not shown, of a semiconductor processing machine or when storing and when stacking a plurality of transport containers vertically.

The rear wall region 6 is constructed as a plenum chamber 15 which has an air inlet 16 in the base region and an air outlet 17 in the cover region 5. The air inlet 16 and the air outlet 17 can be closed by means of pressure valves 18, 19, pressure valve 18 being constructed so as to complement both pressure valve 19 and a valve in a gas reservoir, not shown.

FIG. 5 shows this complementary construction according to which both valves 18, 19 open so as to engage one inside the other. A cylindrical projection 20 at the valve 18 which encloses a lifter 22 which is displaceable against a spring 21 penetrates into a depression 23 in the valve 19 which is constructed as a recess and which likewise encloses a lifter 25 which is displaceable against a spring 24. The mutual enclosing of the valve elements is tied at the same time to a locating and locking function with respect to a transport container in relation to the gas reservoir as well as the transport containers relative to one another. A filter 27 which is held in filter supports 26 within the plenum chamber 15 closes an opening which allows gas to pass into the interior of the container.

For storage purposes or for the charging and unloading of semiconductor processing machines, an individual transport container or the transport container belonging to a connected group of transport containers which are stacked one on top of the other is placed on a holding element, proceeding from which a connection is formed to the gas reservoir via a valve which corresponds to valve 19. The compressed air which enters the plenum chamber of the individual transport container or which enters the chambers of the connected containers forms a corresponding plenum and a uniform, low-turbulence gas flow flows into the interior of the container via the filter 27. When the transport containers are closed, a corresponding internal pressure builds up so as to keep the interior of the container free of particles when opening, especially also particles located in the door gaps. Existing particles are carried away by the gas flow present in the semiconductor processing machine. As the charging and unloading proceeds, the opened transport container is penetrated by a continuously flowing laminar air flow.

While the foregoing description and drawings represent the preferred embodiments of the present invention, it will be obvious to those skilled in the art that various changes and modifications may be made therein without departing from the true spirit and scope of the present invention.

What is claimed is:

1. In a transport container for wafer-shaped objects in which a container enclosure is made up of two lateral regions which are located opposite one another and have projections forming shelves for receiving objects, a base region, a cover region, and a rear wall region, wherein an opening for removing and charging which is located opposite the rear wall region can be closed by a container door and removal and charging are effected in a plane parallel to the surface of the objects, the improvement comprising:

at least parts of the rear wall region being constructed as a plenum chamber which has a closable air inlet and a closable air outlet in said base region and cover region;

a filter forming a connection from the cover region to the interior of the container; and said air inlet being constructed to complement a connection of a gas reservoir and an air outlet of an additional transport container for coupling.

2. The transport container according to claim 1, including valves used in said air inlet and air outlet for opening and closing, a projection at one valve penetrating into a recess at the other valve for reciprocal locating and locking.

3. The transport container according to claim 2, wherein the plenum chamber is coupled with the gas reservoir in the stored state in which said container door closes the container enclosure, as well as when charging and unloading a semiconductor processing machine during which the container enclosure is opened.

* * * * *